(12) United States Patent
Chen

(10) Patent No.: US 6,391,689 B1
(45) Date of Patent: May 21, 2002

(54) METHOD OF FORMING A SELF-ALIGNED THYRISTOR

(75) Inventor: Chin-Yang Chen, Chi-Lung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/875,505

(22) Filed: Jun. 6, 2001

(51) Int. Cl.[7] ............................................. H01L 21/332
(52) U.S. Cl. ........................ 438/135; 438/545; 438/564
(58) Field of Search ................................. 438/133, 135, 438/138, 268, 527, 545, 546, 564

(56) References Cited

U.S. PATENT DOCUMENTS

| | | | | |
|---|---|---|---|---|
| 4,883,767 A | * | 11/1989 | Gray et al. | 438/545 |
| 5,225,702 A | * | 7/1993 | Chatterjee | 257/360 |
| 5,286,981 A | * | 2/1994 | Lilja et al. | 438/135 |
| 5,682,047 A | * | 10/1997 | Consiglio et al. | 257/335 |
| 6,128,216 A | * | 10/2000 | Noble et al. | 365/154 |
| 6,162,665 A | * | 12/2000 | Zommer | 438/133 |

* cited by examiner

Primary Examiner—Chandra Chaudhari
(74) Attorney, Agent, or Firm—Winston Hsu

(57) ABSTRACT

A semiconductor substrate having a doped well region is provided. A gate stacking structure is formed on the doped well region. The gate stacking structure divides the doped well region into a first area and a second area. The second area is masked. The first area is masked. A spacer is formed on each side wall of the gate stacking structure. A dielectric layer is formed on the semiconductor substrate to cover the gate stacking structure, the spacer, the first doped area, and the second doped area. A via is formed on the dielectric layer. An in-situ doped poly-silicon is utilized to fill the via.

18 Claims, 5 Drawing Sheets

METHOD OF FORMING A SELF-ALIGNED THYRISTOR

BACKGROUND OF THE INVENTION

1. Field of the Invention

The present invention relates to a method of forming a self-aligned thyristor, and more particularly, to a method of forming a self-aligned thyristor compatible with MOS transistor fabrication processes and capable of saving a thyristor layout area.

2. Description of the Prior Art

A thyristor is a switching application element capable of being applied to switching to a conductive state from a broken circuit state. The thyristor comprises a three junction $P_1N_1P_2N_2$ electric element. A node contact connected to $P_1$ is an anode, and a node contact connecting to $N_2$ is a cathode. If a gate is added at $P_2$, then the thyristor is called a semiconductor-controlled rectifier (SCR), such as described in US. Pat. Nos. 5,225,702, and 5,682,047.

FIG. 1 is a structure diagram of a prior art thyristor 30 used in a static electricity protection circuit. As shown in FIG. 1, the prior art thyristor 30 is formed on a semiconductor chip 10. The thyristor 30 comprises a silicon substrate 12, a P-well 14 deposited on the silicon substrate 12, corresponding to the above-mentioned $P_1$, an N+ area 16 deposited in the P-well 14, corresponding to the above-mentioned $N_1$, an N-well 18 deposited on the silicon substrate 12 and adjacent to the P-well 14, corresponding to the above-mentioned $N_2$, a P+ area 20 deposited in the N-well 18, corresponding to the above-mentioned $P_2$, and a gate 22 deposited on the P-well 14 at a right side of the N+ area 16. It should be clear to one of ordinary skill in the art that the thyristor 30 has a structure similar to that of a complementary metal-oxide semiconductor (CMOS).

The P-well 14 further comprises a P+ area 15 deposited at a left side of the N+ area 16, and the N-well 18 further comprises an N+ area 19 deposited at a right side of the P+ area 20. Between the P-well 14 and the N-well 18 is deposited an N+ area 21, and the N+ area 21 and the N+ area 16 are used as a source and a drain of the gate 22. Additionally, at the left of the P+ area 15, between the P+ area 15 and the N+ area 16, between the N+ area 16 and the N+ area 21 (under the gate 22), between the N+ area 21 and the P+ area 20, between the P+ area 20 and the N+ area 19, and at the right side of the N+ area 19, field oxide is deposited to perform isolation.

In the prior art, the P+ area 15 and the N+ area 16 are electrically connected to an anode 24 with multilevel interconnects 23, and the P+ area 20 and the N+ area 19 are electrically connected to a cathode 26 with multilevel interconnects 25. The gate 22 is also electrically connected to the cathode 26 by the multilevel interconnects 25. The above-mentioned thyristor 30 is deposited between an I/O device (not shown) and a pad (not shown) to avoid static electricity destroying a product in the pad.

The thyristor is a bipolar device with characteristics of being bistable and having a negative differential resistance (NDR), so it can also be used as a static random access memory (SRAM), such as described in U.S. Pat. No. 6,128, 216.

Please refer to FIG. 2. FIG. 2 is a characteristic diagram of a current-voltage relationship of the thyristor 30. The cross axle is voltage, and the vertical axle is current. 31–32 is a reverse breakdown region, 32–33 is a reverse blocking region, 33–34 is a forward blocking region, 34–35 is an NDR region, and 35–36 is a forward conducting region. The SRAM with the characteristic of having negative differential resistance is operating in the NDR region 34–35 shown in FIG. 2.

However, in contrast with a dynamic random access memory (DRAM), integration of the SRAM is not high. Therefore, if the structure of the prior art thyristor 30 (similar with the structure of the complementary metal-oxide semiconductor, having both P-well 14 and N-well 18) is used as SRAM, the thyristor 30 occupies a large layout area, and does not raise integration. To solve this problem, as described in above-mentioned U.S. Pat. No. 6,128,216, two PNPN diodes share an N-type area to increase integration. However, the process is complicated, and different from the present invention.

SUMMARY OF THE INVENTION

It is therefore a primary objective of the present invention to provide a self-aligned thyristor that raises integration of an SRAM.

Another objective of the present invention is to provide a method of forming a self-aligned thyristor.

According to claimed invention, a doped well region is of a first conductivity type. A gate stacking structure is formed on the doped well region. The gate stacking structure comprises an isolating layer formed on the semiconductor substrate, a conductive layer deposited on the isolating layer, and a passivation layer deposited on the conductive layer. The gate stacking structure divides the doped well region into a first area and a second area. A first ion implantation process of a second conductivity type is performed to form a first doped area in the first area. A second ion implantation process of a second conductivity type is then performed to form a second doped area in the second area. A doping concentration of the second doped area is higher than a doping concentration of the first doped area. A spacer is formed on each side wall of the gate stacking structure. A dielectric layer is formed on the semiconductor substrate to cover the gate stacking structure, the spacer, the first doped area, and the second doped area. A via is formed on the dielectric layer above the first doped area. An in-situ doped poly-silicon layer of the first conductivity type dopant is formed on the dielectric layer. The first conductivity type dopant of the poly-silicon layer is thermally driven in to form a third doped area in the first doped area. A doping concentration of the third doped area is higher than a doping concentration of the semiconductor substrate.

It is an advantage of the present invention that integration of the SRAM is increased, and it is another advantage of the present invention that a Metal-Oxide-Semiconductor process can be used to form the thyristor.

These and other objectives and advantages of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
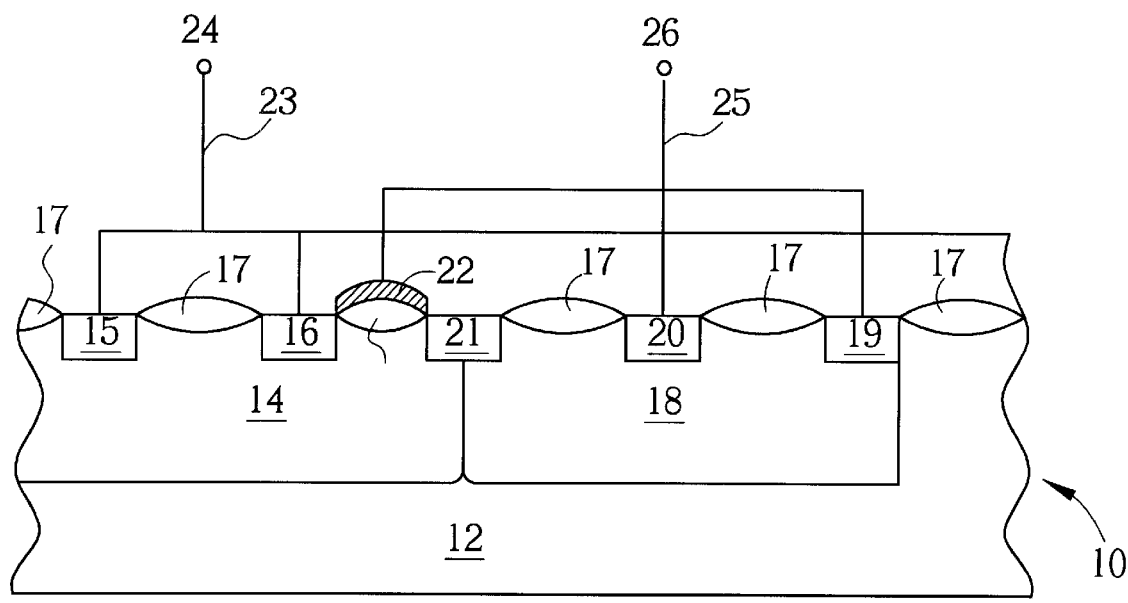
FIG. 1 is a structure diagram of a prior art thyristor used in a static electricity protection circuit.
Figure 2:
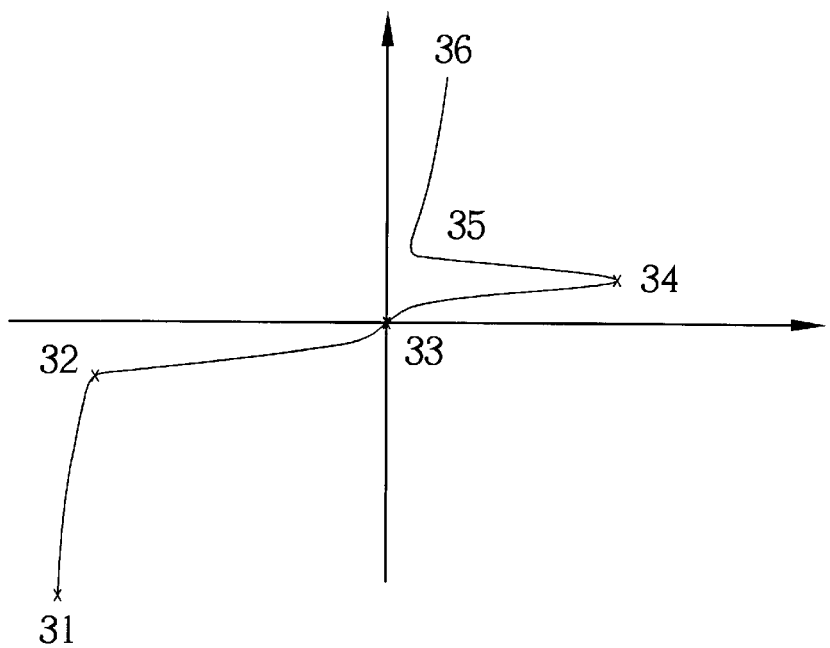
FIG. 2 is a characteristic diagram of a current-voltage relationship of the thyristor of FIG. 1.
Figure 3:
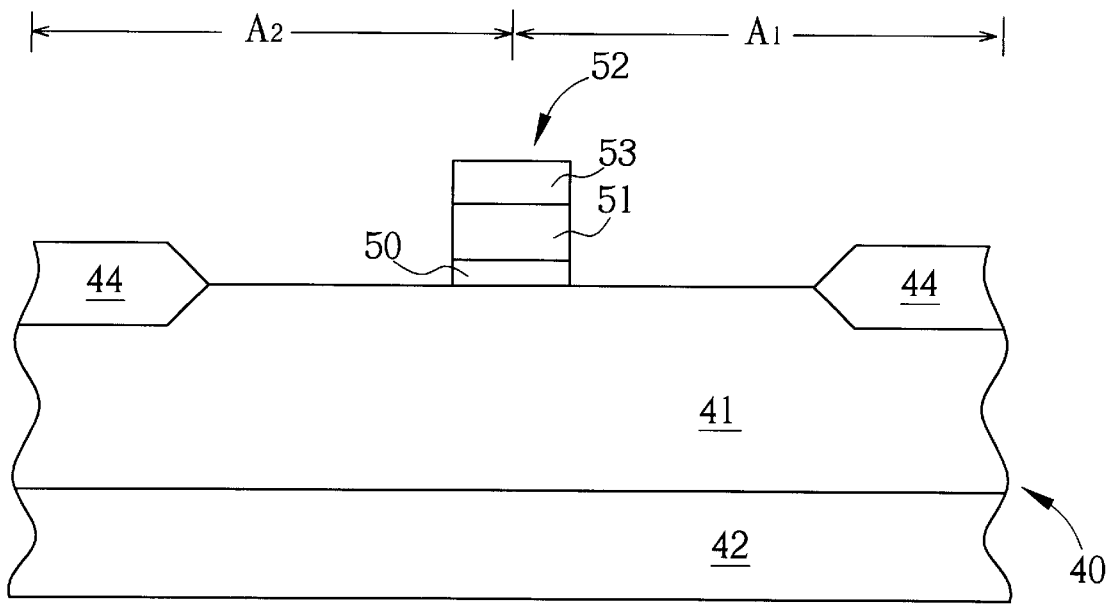
FIG. 3 to FIG. 8 are diagrams of the present invention method of forming a thyristor on a surface of a semiconductor chip.

Please refer to FIG. 3 to FIG. 8. FIG. 3 to FIG. 8 are diagrams of the present invention method of forming a thyristor 60 on a surface of a semiconductor chip 40. As shown in FIG. 3, the semiconductor chip 40 comprises an N-type silicon substrate 42, and a P-type doped well region 41 isolated by two field oxides 44. A doping concentration ranges from $1E17/cm^3$ to $1E19/cm^3$. The present invention method first forms a gate stacking structure 52 on a predetermined area of a surface of the doped well region 41. The gate stacking structure 52 comprises a gate isolating layer 50, formed of $SiO_2$ deposited on the doped well region 41 of the surface of the silicon substrate 42 to be a gate oxidation layer of the gate stacking structure 52, a doped poly-silicon 51 deposited on the gate isolating layer 50 to be a gate conductive layer of the gate stacking structure 52, and a passivation layer 53 deposited on the doped poly-silicon 51. The passivation layer 53 is formed of silicon nitride, and the gate stacking structure 52 divides the doped well region 41 into a first area A1 and a second area A2.

Figure 4:
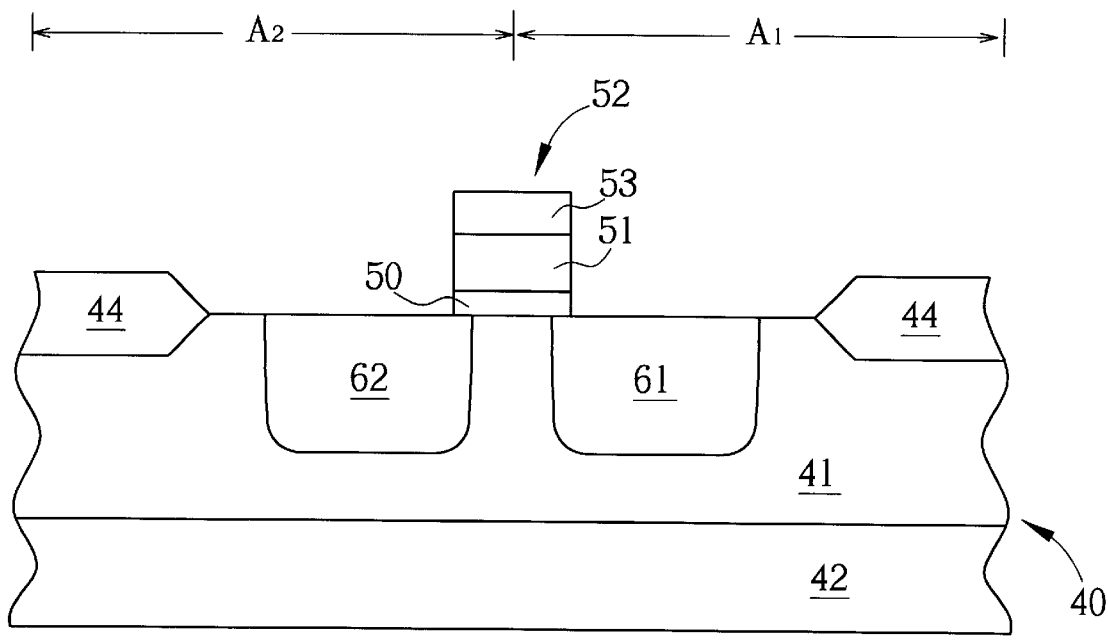

Next, please refer to FIG. 4. The second area A2 is masked with a photomask or a photoresist layer (not shown) and a first ion implantation process utilizing an N-type dopant is performed to form a first doped area 61 adjacent to the gate stacking structure 52 in the first area A1. Next, the first area A1 is masked with a photomask or a photoresist layer (not shown) and a second ion implantation process utilizing a P-type dopant is performed to form a second doped area 62 adjacent to the gate stacking structure 52 in the second area A2. The first ion implantation process uses phosphorous or arsenic atoms, and the doping concentration of the first doped area 61 ranges from $1E17/cm^3$ to $1E19$ atoms/$cm^3$. The second ion implantation process uses phosphorous or arsenic atoms, and the doping concentration of the second doped area 62 ranges from $1E19/cm^3$ to $1E21$ atoms/$cm^3$, which is higher than the doping concentration of the first doped area 61. Additionally, the first doped area 61 and the second doped area 62 are separate, not partially overlapped.

When forming the first doped area 61 and the second doped area 62, an annealing process can be added to drive in ions by spreading to form the needed concentration spread. At the same time, the damaged lattice structure of the surface of the silicon substrate 42 in the first ion implantation process and the second ion implantation process is mended.

Figure 5:
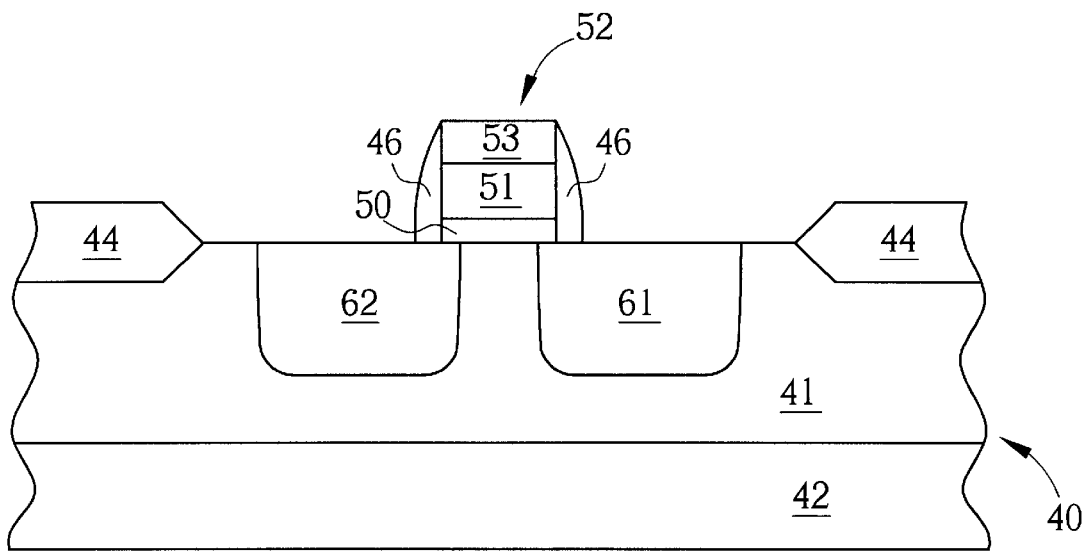

As shown in FIG. 5, a SiN layer 46 with an even thickness is formed on the surface of the semiconductor chip 40 to cover the surface of the silicon substrate 42 and the gate stacking structure 52. Then an anisotropic dry etching process is performed to evenly remove the SiN layer 46 downward until the surface of the silicon substrate 42 is reached, and make the remaining SiN layer 46 around the two vertical side walls of the gate stacking structure 52 form a spacer 49.

Figure 6:
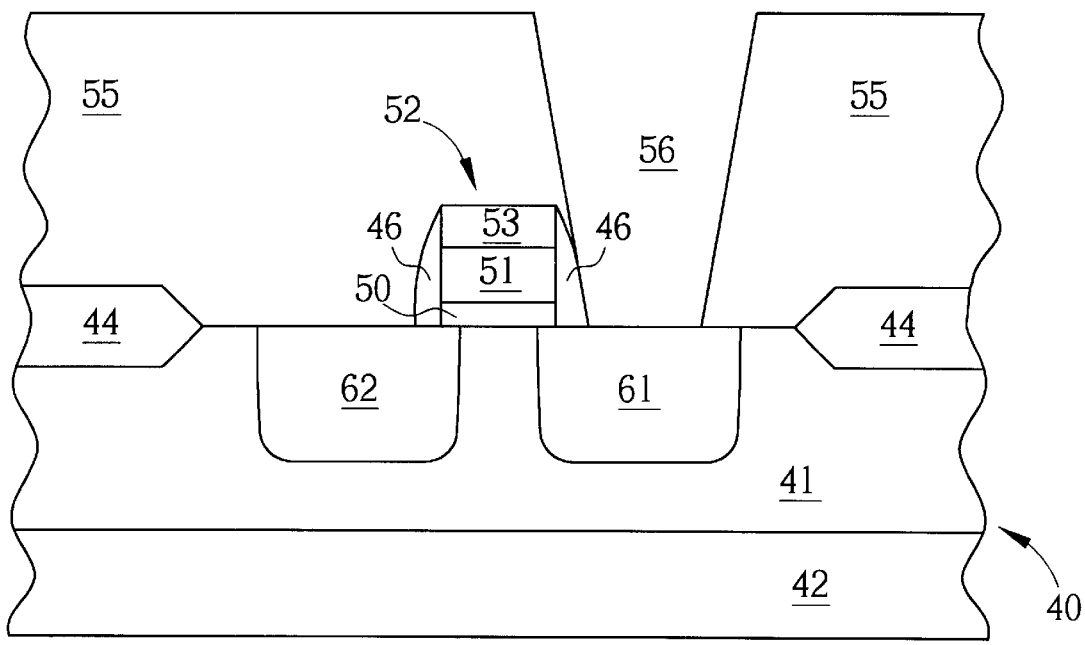

As shown in FIG. 6, a dielectric layer 55 is then formed on the surface of the semiconductor chip 40 to cover the gate stacking structure 52, the spacer 49, the first doped area 61, and the second doped area 62. Next, a photoresist layer (not shown) is deposited on the dielectric layer 55 as a hard mask layer, and a lithography process is performed to shift a pattern of a via 56 to the photoresist layer, so that the photoresist layer (i.e. the hard mask layer) comprises an opening 57 to define a position of the via 56. An etching process is performed through the opening 57 to remove a corresponding region in the dielectric layer 55, up to the surface of the first doped area 61, to form the via 56 in the dielectric layer 55 above the first doped area 61. Finally, the photoresist layer is removed.

Figure 7:
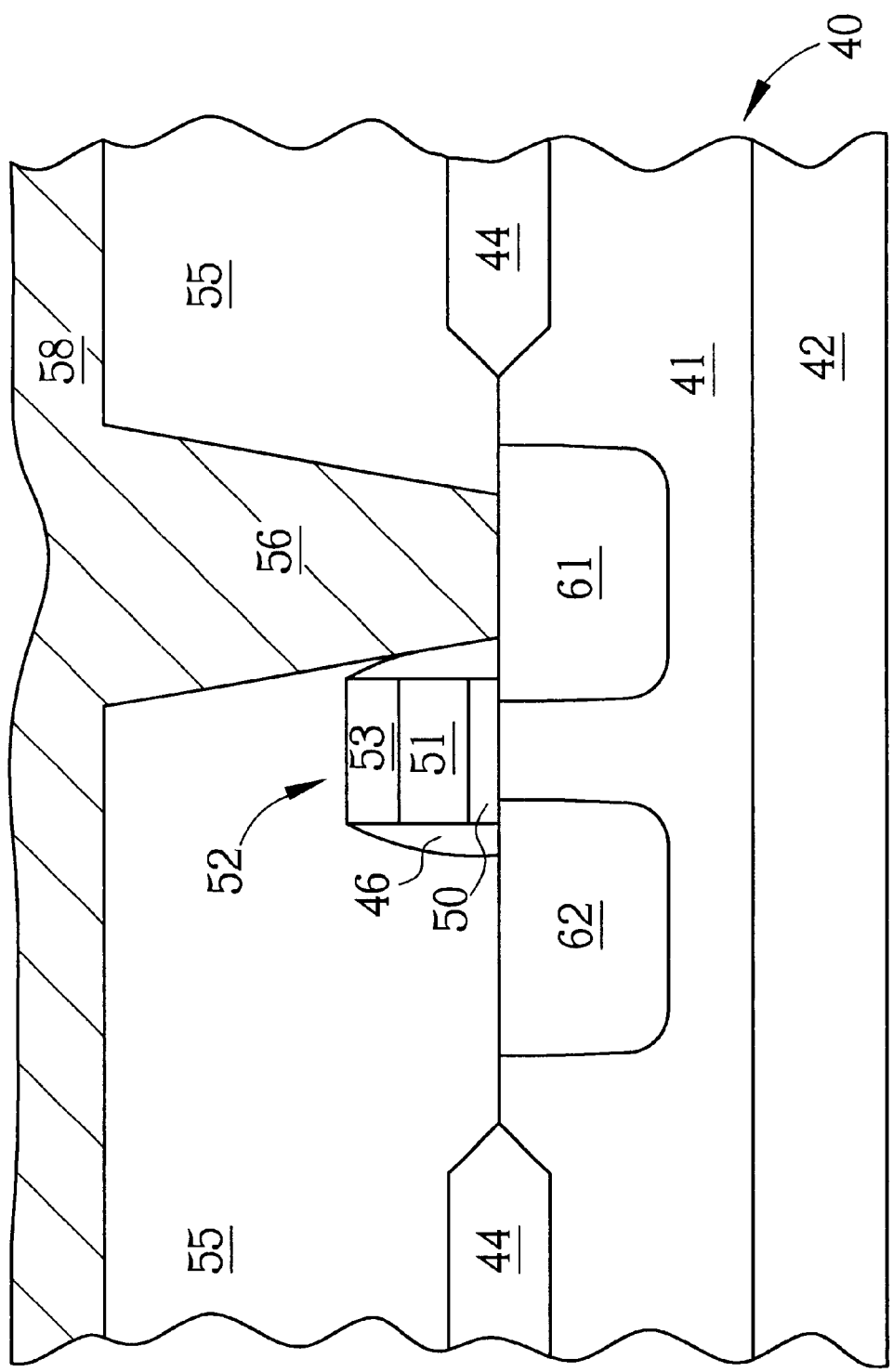

As shown in FIG. 7, a low pressure chemical vapor deposition (LPCVD) process is utilized to deposit a poly-silicon layer on the surface of the semiconductor chip 40. By performing the low pressure chemical vapor deposition, a P-type dopant is in-situ doped into the poly-silicon to fill the via 56 with a P-type in-situ doped poly-silicon 58.

Figure 8:
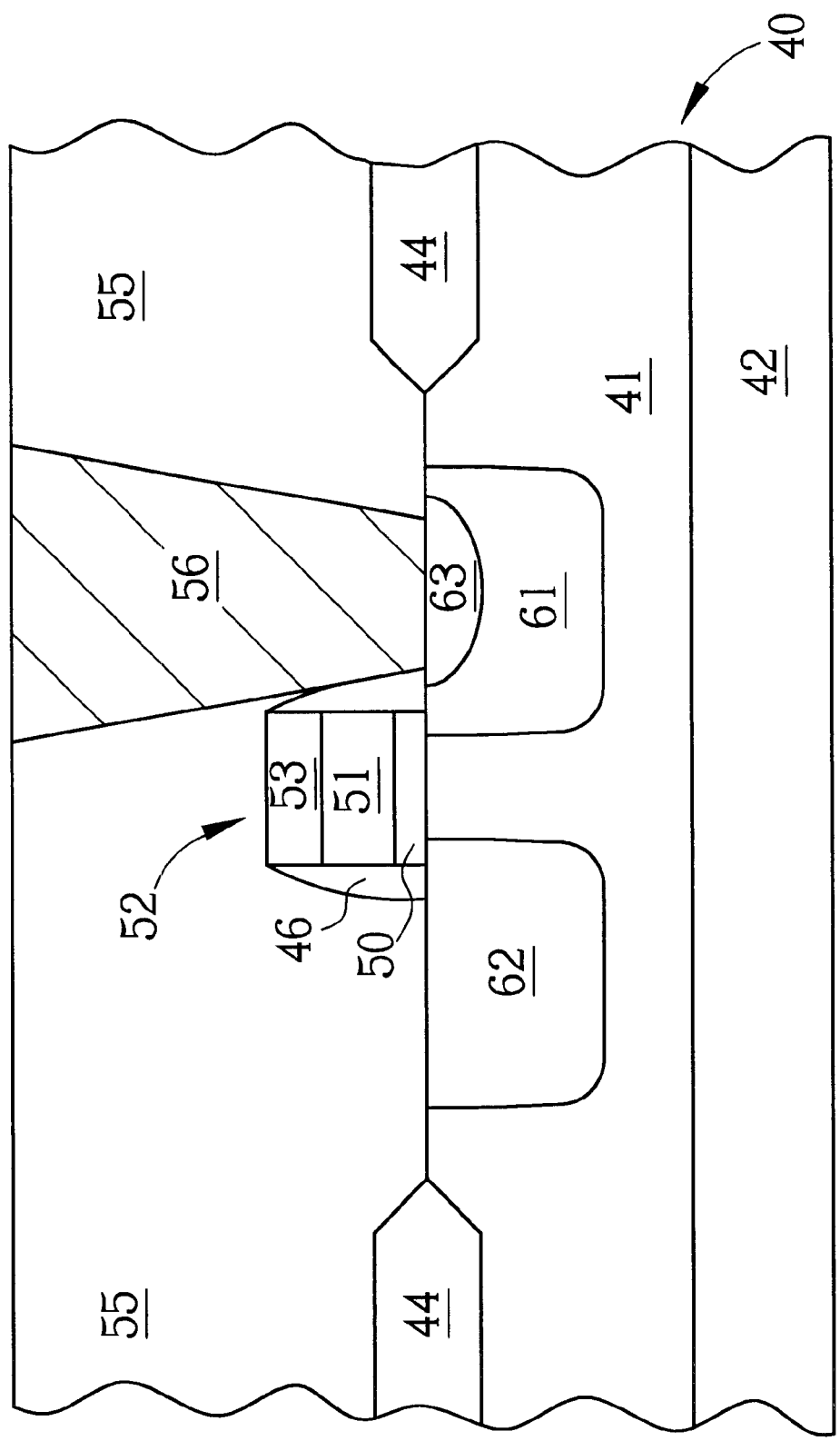

As shown in FIG. 8, a chemical mechanical polishing (CMP) process, or an etch back process, is performed on the poly-silicon 58 above the surface of the dielectric layer 55, so that the poly-silicon 58 of the via 56 can be approximately uniform with the surface of the dielectric layer 55. Next, the P-type dopant of the poly-silicon 58 is treated as a solid state diffusion source to thermally drive the P-type dopant of the poly-silicon 58 to form a third doped area 63 in the first doped area 61. The P-type dopant is a IIIA-type dopant, such as boron or $BF_2^+$, and the doping concentration of the third doped area 63 ranges from $1E19$ atoms/$cm^3$ to $1E21$ atoms/$cm^3$, which is higher than the doping concentration of the semiconductor substrate 42. In addition, the third doped area 63 is included in the first doped area 61 adjacent to the spacer 49 of the gate stacking structure 52, and does not contact the second doped area 62 or the doped well region 41.

A second preferred embodiment of the present invention replaces the above-mentioned areas doped with the P-type dopant (including the P-well) with the N-type dopant, and replaces the above-mentioned areas doped with the N-type dopant (including the N-type silicon substrate) with the P-type dopant.

A third preferred embodiment of the present invention replaces the above mentioned semiconductor chip with a silicon on insulator (SOI) comprising a silicon substrate, a first isolating layer formed on the silicon substrate, and a silicon layer formed on the first isolating layer. The silicon layer can comprise a P-type or N-type doped well region. The other processes are the same as the above-mentioned, so further details are excluded.

The present invention utilizes processes similar to processes utilized in forming MOS to form SRAM. At the same time, the present invention does not need to simultaneously use P-well's and N-well's with large areas to form the thyristor, so unnecessary areas can be saved, and integration of SRAM can be raised.

In the contrast to the prior art, the present invention can use a smaller area to form a self-aligned thyristor, and suits VLSI (very large scale integrated circuits) processes by having high integration, unlike the prior art.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a self-aligned thyristor, the method comprising:

providing a semiconductor substrate comprising a doped well region, the doped well region being of a first conductivity type;

forming a gate stacked structure on the doped well region, the gate stacked structure comprising an insulation layer formed on the semiconductor substrate, a conductive layer deposited on the insulation layer, and a passivation layer deposited on the conductive layer, the gate stacked structure dividing the doped well region into a first area and a second area;

masking the second area, and performing a first ion implantation process of a second conductivity type to form a first doped area in the first area;

masking the first area, and performing a second ion implantation process of a second conductivity type to form a second doped area in the second area, a doping concentration of the second doped area being higher than a doping concentration of the first doped area;

forming a spacer on each wall of the gate stacked structure;

forming a dielectric layer on the semiconductor substrate to cover the gate stacked structure, the spacers, the first doped area, and the second doped area;

forming a via on the dielectric layer above the first doped area;

forming an in-situ doped poly-silicon layer of the first conductivity type on the dielectric layer; and thermally driving in the first conductivity type dopant of the poly-silicon layer to form a third doped area in the first doped area, a doping concentration of the third doped area being higher than a doping concentration of the semiconductor substrate.

2. The method of claim 1 wherein forming the via comprises:

forming a hard mask layer on the dielectric layer, the hard mask layer comprising an opening that defines a position of the via; and performing an etching process through the opening to remove the dielectric layer down to the first doped area.

3. The method of claim 1 wherein the semiconductor substrate is an N-type silicon substrate, the doped well region is a P-type well, and the second conductivity type is N-type.

4. The method of claim 3 wherein the doping concentration of the P-type well ranges from 1E17 atoms/cm$^3$ to 1E19 atoms/cm$^3$.

5. The method of claim 1 wherein the first ion implantation process uses phosphorous or arsenic atoms, and the doping concentration of the first doped area ranges from 1E17 atoms/cm$^3$ to 1E19 atoms/cm$^3$.

6. The method of claim 1 wherein the second ion implantation process uses phosphorous or arsenic atoms, and the doping concentration of the second doped area is between 1E19 atoms/cm$^3$ to 1E21 atoms/cm$^3$.

7. The method of claim 1 wherein the first conductivity type dopant of the poly-silicon layer is a IIIA-type dopant, and the doping concentration of the third doped area ranges from 1E19 atoms/cm$^3$ to 1E21 atoms/cm$^3$.

8. The method of claim 1 wherein the semiconductor substrate is a P-type silicon substrate, the doped well region is an N-type well, and the second conductivity type is P-type.

9. The method of claim 8 wherein a doping concentration of the N-type well ranges from 1E17 to 1E19 atoms/cm$^3$.

10. The method of claim 1 wherein the first ion implantation process uses IIIA-type dopants, and the doping concentration of the first doped area ranges from 1E17 atoms/cm$^3$ to 1E19 atoms/cm$^3$.

11. The method of claim 1 wherein the second ion implantation process uses IIIA-type dopants, and the doping concentration of the second doped area ranges from 1E19 atoms/cm$^3$ to 1E21 atoms/cm$^3$.

12. The method of claim 1 wherein the first conductivity type dopant of the poly-silicon layer is phosphorous or arsenic, and the doping concentration of the third doped area ranges from 1E19 atoms/cm$^3$ to 1E21 atoms/cm$^3$.

13. A method of forming a self-aligned thyristor, the method comprising:

providing a silicon on insulator (SOI) substrate, the SOI substrate comprising a silicon substrate, a first insulating layer formed on the silicon substrate, a silicon layer formed on the first insulating layer, the first insulating layer comprising a P-type doped well region;

forming a gate stacked structure on the P-type doped well region, the gate stacked structure comprising a second insulating layer formed on the SOI substrate, a conductive layer deposited on the second insulating layer, and a passivation layer deposited on the conductive layer, the gate stacked structure dividing the P-type doped well region into a first area and a second area;

masking the second area, and performing a first N-type ion implantation process to form a first doped area in the first area;

masking the first area, and performing a second N-type ion implantation process to form a second doped area in the second area, a doping concentration of the second doped area being higher than a doping concentration of the first doped area;

forming a spacer on each wall of the gate stacked structure;

forming a dielectric layer on the SOI substrate to cover the gate stacked structure, the spacers, the first doped area, and the second doped area;

forming a via on the dielectric layer above the first doped area;

forming an in-situ doped P-type poly-silicon layer on the dielectric layer; and thermally driving in the P-type dopants of the poly-silicon layer to form a third doped area in the first doped area, a doping concentration of the third doped area being higher than a doping concentration of the SOI substrate.

14. The method of claim 13 wherein forming the via comprises:

forming a hard mask layer on the dielectric layer, the hard mask layer comprising an opening defining a position of the via; and performing an etching process through the opening to remove the dielectric layer down to the first doped area.

15. The method of claim 13 wherein the doping concentration of the P-type well ranges from 1E17 atoms/cm$^3$ to 1E19 atoms/cm$^3$.

16. The method of claim 13 wherein the first ion implantation process uses phosphorous or arsenic, and a doping concentration of the first doped area ranges from 1E17 atoms/cm$^3$ to 1E19 atoms/cm$^3$.

17. The method of claim 13 wherein the second ion implantation process uses phosphorous or arsenic, and a doping concentration of the second doped area ranges from 1E19 atoms/cm$^3$ to 1E21 atoms/cm$^3$.

18. The method of claim 13 wherein the P-type dopants of the poly-silicon layer are IIIA-type dopants, and a doping concentration of the third doped area ranges from 1E19 atoms/cm$^3$ to 1E21 atoms/cm$^3$.

* * * * *